(12) United States Patent
Tandy

(10) Patent No.: US 6,998,714 B2
(45) Date of Patent: Feb. 14, 2006

(54) SELECTIVELY COATING BOND PADS

(75) Inventor: Patrick W. Tandy, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/721,062

(22) Filed: Nov. 24, 2003

(65) Prior Publication Data

US 2004/0150106 A1 Aug. 5, 2004

Related U.S. Application Data

(60) Continuation of application No. 09/769,976, filed on Jan. 25, 2001, now abandoned, which is a division of application No. 09/382,930, filed on Aug. 25, 1999, now Pat. No. 6,403,457.

(51) Int. Cl.
*H01L 23/48* (2006.01)

(52) U.S. Cl. .................. 257/768; 257/769; 257/775

(58) Field of Classification Search ............ 257/775, 257/781, 768, 769
See application file for complete search history.

(56) References Cited

U.S. PATENT DOCUMENTS 5,380,679 A * 1/1995 Kano ..................... 438/628
5,625,734 A * 4/1997 Thomas et al. ............ 385/88
5,693,565 A * 12/1997 Camilletti et al. .......... 438/17
5,909,633 A * 6/1999 Haji et al. ................ 438/612

FOREIGN PATENT DOCUMENTS

| | | | |
|---|---|---|---|
| JP | 05315731 A | * | 11/1993 |
| JP | H10-163241 | | 6/1998 |
| JP | 11067957 A | * | 3/1999 |
| JP | H11-67957 | | 3/1999 |

* cited by examiner

*Primary Examiner*—Tom Thomas
*Assistant Examiner*—N. Drew Richards
(74) *Attorney, Agent, or Firm*—Trop, Pruner & Hu, P.C.

(57) ABSTRACT

Solder ball bond pads and wire bond pads may be selectively coated so that the wire bond bond pads have a thicker gold coating than the solder ball bond pads. This may reduce the embrittlement of solder ball joints while providing a sufficient thickness of gold for the wire bonding process. In general, gold coatings are desirable on electrical contact surfaces to prevent oxidation. However, the thickness of gold which is necessary on solder ball bond pads may be less and excessive gold may be disadvantageous. Thus, by masking the solder ball bond pads during the gold coating of the wire bond bond pads, a differential gold thickness may be achieved which is more advantageous for each application.

19 Claims, 2 Drawing Sheets

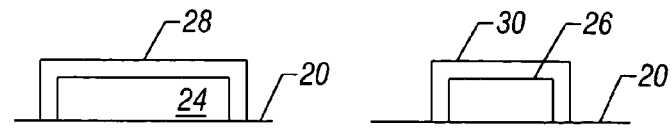
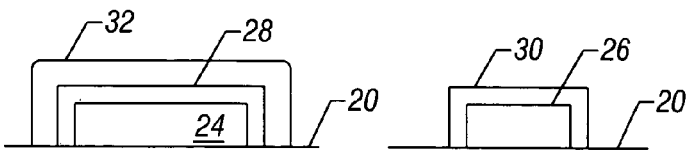
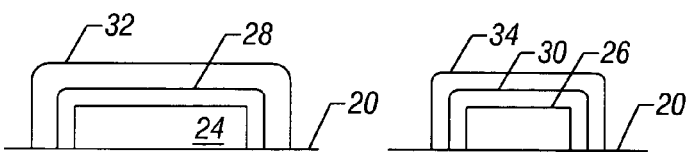
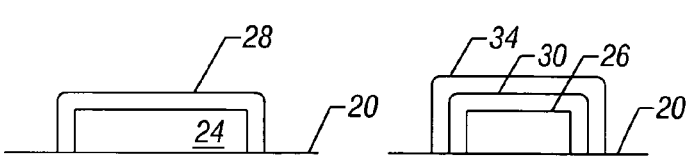
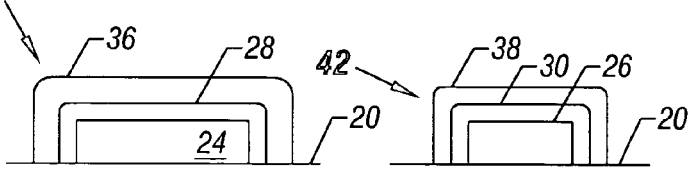
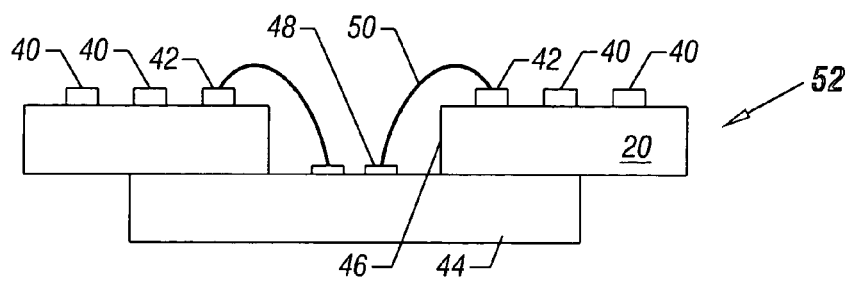

SELECTIVELY COATING BOND PADS

This is a continuation application of application Ser. No. 09/769,976, filed Jan. 25, 2001, now abandoned, which is a divisional of application Ser. No. 09/382,930, filed Aug. 25, 1999, now U.S. Pat. No. 6,403,457.

BACKGROUND

This invention relates generally to coating bond pads in the fabrication of integrated circuits.

It is generally desirable to coat wire bond pads and solder ball bond pads with nickel and gold. Currently these coating processes are implemented simultaneously on both types of bond pads. Wire bond bond pads typically need more gold than solder ball bond pads. Too little gold causes wire bonding problems. Too much gold causes solder ball joint embrittlement.

As a result, in situations in which both types of bond pads are contained on the same structure, conventional processing provides either too much gold to suit the solder ball bond pads or to~ little gold to suit the wire bond pads. Certainly, providing excessive gold coatings is generally not cost effective.

Thus, there is a need for a better way to coat bond pads in fabricating structures with both solder ball and wire bond bond pads.

SUMMARY

In accordance with one aspect, a method of coating solder ball and wire bond pads includes masking the solder ball pads. Gold is coated on the wire bond pads with the solder ball pads masked.

Other aspects are set forth in the accompanying detailed description and claims.

BRIEF DESCRIPTION OF THE DRAWINGS

FIG. 1 is a process flow for one embodiment of the present invention;

FIG. 2 is an enlarged cross-sectional view of a solder ball and a wire bond pad after nickel plating;

FIG. 3 is an enlarged cross-sectional view of the embodiment shown in FIG. 2 after the solder ball bond pad has been masked;

FIG. 4 is an enlarged cross-sectional view corresponding to the embodiment shown in FIG. 3 after a thicker gold coat has been applied;

FIG. 5 is an enlarged cross-sectional view after the solder ball bond pads have been unmasked;

FIG. 6 is an enlarged cross-sectional view of the embodiment shown in FIG. 5 after a thinner gold coat has been applied;

FIG. 7 is an enlarged cross-sectional view of the finished structure in accordance with one embodiment of the present invention;

DETAILED DESCRIPTION

Figure 8:
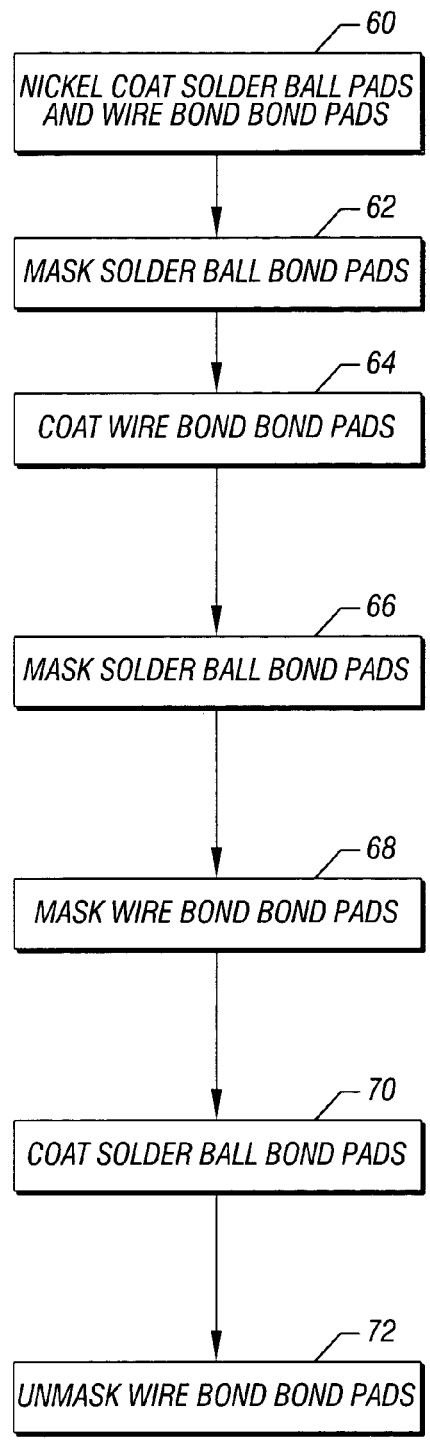
FIG. 8 is a process flow for another embodiment of the present invention.

A process for differentially coating solder ball bond pads and wire bond pads, shown in FIG. 1, may begin, in one embodiment of the present invention, by nickel plating wire bond pads 26 and solder ball bond pads 24 as indicated in block 10 of FIG. 1. As used herein, the term "coating" is intended to encompass conventional electrolytic and electroless plating processes as well as aqueous immersion coating processes. Thus, the term "coating" is intended to be broader than conventional plating processes and is intended to refer to causing a metal layer to bond on top of another metal material.

Conventional techniques for nickel coating include immersion using a chemical reducing agent such as sodium hypophosphate to reduce nickel salts. Such coatings may result in alloys with four to twelve percent phosphorus. However, conventional electrolytic and electroless nickel plating processes may be utilized as well.

Referring to FIG. 2, a solder ball bond pad 24 may be positioned on a support structure 20 which also may bear a wire bond bond pad 26. In the illustrated embodiment, the solder ball bond pad 24 is illustrated as being larger than the wire bond bond pad. However, the present invention is not limited in any way to any particular geometry of the bond pads. The solder ball bond pad 24 has a nickel coating 28 coated on it and the wire bond bond pad 26 is coated with a nickel coating 30.

The solder ball bond pad 24 is then masked as indicated in block 12 of FIG. 1. This is illustrated by the coating 32 in FIG. 3. Any suitable masking material may be utilized as the coating 32 including patterned dry film resist.

Referring again to FIG. 1, a thicker gold coating is applied to the wire bond bond pad 26, as indicated in block 14. No coating is applied to the solder ball bond pad 24 which is masked off. The resulting thicker gold coating 34, shown in FIG. 4, may be on the order of 0.1 to about 0.4 microns in thickness.

Next the solder ball bond pad 24 may be unmasked, as indicated in block 16. As illustrated in FIG. 5, the mask 32 has been removed, for example using an etching technique. Thereafter, a thinner gold coating may be applied as indicated in block 18 in FIG. 1.

Thus, as shown in FIG. 6, a thinner gold coating 36 may be applied over the nickel coating 28 on the solder ball bond pad 24. The same coating may be added to the coating 34 applied to the wire bond bond pad 26 to form a composite gold layer 38. Any of a variety of coating techniques, including electroless coating, immersion, and electrolytic plating, may be utilized to form the thinner gold coating.

While the coating is applied in two steps to the wire bond bond pads in the embodiments illustrated in FIGS. 1–6, it is also possible to provide the wire bond gold coating in one single step and then to mask off the wire bond bond pads to provide the thinner gold coating only on the solder ball bond pads.

As a result of the processing described above, the solder ball bond pads may have a gold coating with a thickness on the order of 0.1 to about 0.3 microns. One advantageous coating thickness is about 0.25 microns. In general, it is desirable to provide a coating thickness on the solder ball bond pads which is sufficiently small to reduce solder ball joint embrittlement. It is also desirable to have a coating which is thick enough to prevent oxidation.

At the same time, it is desirable to provide a conventional thickness of gold on the wire bond pads to provide a good wire bond when using conventional wire bond bonding techniques. A suitable gold coating 38 thickness on the wire bond bond pads is about 0.5 microns.

In some embodiments of the present invention, the solder ball bond pad 24 may be copper or copper coated. The wire bond bond pad 26 may be formed, for example, of aluminum. However, other materials which are compatible with gold coating techniques may also be used.

Referring to FIG. 7, one embodiment of a package 52 made in accordance with the techniques described above includes a laminate core 20. The laminate core 20 may be formed of an insulating material having a plurality of internal trace layers (not shown). Interconnections may be formed between various trace layers and the bond pads 40 and 42 contained on a surface of the core 20. The bond pads 40 may be solder ball bond pads for coupling to solder balls (not shown). The bond pads 42 may be wire bond bond pads for coupling to bonding wires 50 also wire bonded to a die 44 through an opening 46 in the laminate core 20.

The solder ball bond pads 40 and wire bond bond pads 42 on the same surface may be gold coated to different thicknesses, as described above, to achieve a more desirable performance.

As illustrated in FIG. 8, in accordance with another embodiment of the present invention, the solder ball and wire bond bond pads are nickel coated as indicated in block 60. This step is illustrated in FIG. 2. Next, the solder ball bond pads are masked as indicated in block 62 and FIG. 3.

Figure 9:
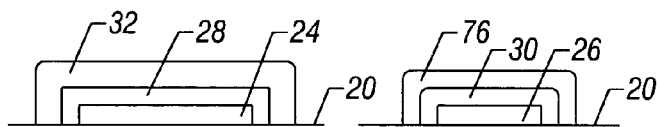
FIG. 9 is an enlarged cross-sectional view of a solder ball and a wire bond bond pad after the wire bond bond pads have been coated with gold.

The wire bond bond pads 26 are coated as indicated in block 64. In this embodiment, the wire bond bond pads 26 are coated in one step to the full desired thickness. The wire bond bond pad coating is indicated at 76 in FIG. 9. The masking layer over the solder ball bond pads is indicated at 32.

Figure 10:
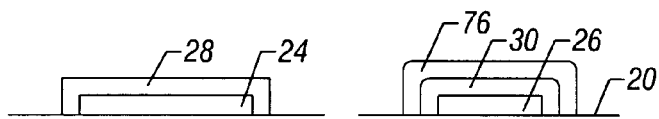
FIG. 10 is an enlarged cross-sectional view after the solder ball bond pads have been unmasked.

Next the solder ball bond pads are unmasked as indicated at block 66 in FIG. 8. As shown in FIG. 10, the mask 32 has been removed for example by etching.

Figure 11:
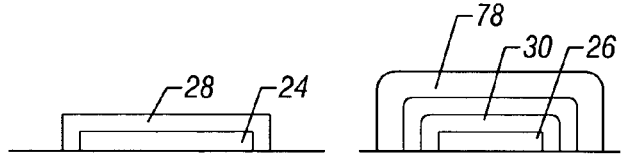
FIG. 11 is an enlarged cross-sectional view after the wire bond bond pads have been masked.

Referring again to FIG. 8, the wire bond bond pads are masked as indicated in block 68. The mask 78 is shown in position over the wire bond bond pads 26 in FIG. 11.

Figure 12:
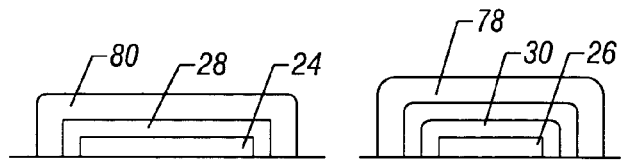
FIG. 12 is an enlarged cross-sectional view after the solder ball bond pads have been coated.
Figure 13:
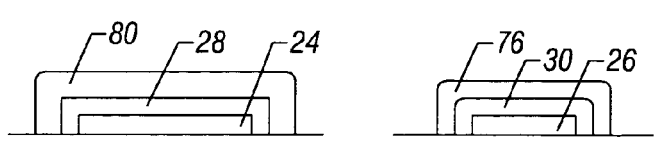
FIG. 13 is an enlarged cross-sectional view after the wire bond bond pads have been unmasked.

The solder ball bond pads 24 may then be coated as suggested in block 70 and as illustrated at 80 in FIG. 12. The wire bond bond pads 26 may be unmasked (block 72 in FIG. 8). As shown in FIG. 13, the mask 78 has been removed. In some embodiments, different coating techniques may be used for solder ball versus wire bond bond pads.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A device comprising:
   a first and second bond pad, said first and second bond pads comprising a nickel coated metal;
   a first gold coating on said first and second bond pad, the first gold coating having a given thickness;
   a second gold coating on said second bond pad, said second gold coating and said first gold coating forming a composite gold coating having another thickness greater than the thickness of said first gold coating;
   a support structure having parallel surfaces, said second bond pad on one parallel surface of said support structure; and
   a chip on another parallel surface of said support structure, said chip and said second bond pad linked by an electrically conductive element.

2. The device of claim 1 wherein the first bond pad comprises a nickel coated copper.

3. The device of claim 2 wherein the second bond pad comprises a nickel coated aluminum.

4. The device of claim 1 wherein the composite gold coating on the second bond pad has a thickness of about 0.5 microns.

5. The device of claim 1 wherein the first and second bond pads coexist on said one parallel surface of said support structure.

6. A package integrated circuit device comprising:
   a support structure having parallel surfaces;
   a die on one of said parallel surfaces;
   a plurality of bond pads on another of said parallel surfaces, at least one of said plurality of bond pads coupled to said die by a wire; and
   a first and second gold coating of different thickness, said first gold coating on said bond pad coupled to said die by the wire, said second gold coating on the bond pads not coupled to said die by a wire.

7. The device of claim 6 including surface mount material on said bond pads not coupled to said die by a wire.

8. The device of claim 6 wherein the first gold coating is thicker than said second gold coating.

9. The device of claim 8 wherein the first gold coating has a thickness of about 0.5 microns.

10. The device of claim 8 wherein the second gold coating has a thickness of approximately 0.1 to 0.3 microns.

11. The device of claim 6 wherein the thickness of the second gold coating is sufficiently low to reduce the likelihood of solder ball joint embrittlement.

12. The device of claim 6 wherein the support structure is a laminate structure.

13. The device of claim 6 wherein the support structure has an opening and said bond pad coupled to said die by said wire is coupled to said die trough the opening in said structure.

14. The device of claim 6 wherein said plurality of bond pads comprise a nickel coated metal.

15. The device of claim 14 wherein said bond pad coupled to said die by said wire comprises a nickel coated metal that is different from the nickel coated metal of the bond pads not coupled to said die by said wire.

16. The device of claim 15 wherein one nickel coated metal is aluminum and the other nickel coated metal is copper.

17. The device of claim 1 wherein the first gold coating has a thickness of approximately 0.1 to 0.3 microns.

18. The device of claim 1 wherein the electrically conductive element is a gold wire.

19. The device of claim 18 wherein the support structure has an opening and said wire passes through said opening.

* * * * *